(12) United States Patent
Tsai et al.

(10) Patent No.: US 12,274,023 B2
(45) Date of Patent: Apr. 8, 2025

(54) CURRENT MODE FAN CONTROL AND TACHOMETER REPORTING DESIGN

(71) Applicant: Dell Products L.P., Round Rock, TX (US)

(72) Inventors: Mengru Tsai, Taipei (TW); Lei Wang, Austin, TX (US); Chen Chi Hsieh, Taipei (TW); Timothy M. Lambert, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 591 days.

(21) Appl. No.: 17/556,489

(22) Filed: Dec. 20, 2021

(65) Prior Publication Data

US 2023/0200003 A1    Jun. 22, 2023

(51) Int. Cl.
*H05K 7/20* (2006.01)
*G06F 1/20* (2006.01)

(52) U.S. Cl.
CPC .......... *H05K 7/20209* (2013.01); *G06F 1/20* (2013.01); *H05K 7/20136* (2013.01); *G06F 2200/201* (2013.01)

(58) Field of Classification Search
CPC .......... H05K 7/20209; H05K 7/20136; H05K 7/20727; G06F 1/20; G06F 2200/201; G06F 1/206
See application file for complete search history.

(56) References Cited

U.S. PATENT DOCUMENTS

| | | | | |
|---|---|---|---|---|
| 5,962,933 A | * | 10/1999 | Henderson | G06F 11/0772 307/130 |
| 6,135,718 A | * | 10/2000 | Yang | F04D 27/004 318/599 |
| 6,380,704 B1 | * | 4/2002 | Chin | F04D 27/004 318/434 |
| 6,737,824 B1 | * | 5/2004 | Aslan | H02P 23/20 318/471 |
| 2003/0234630 A1 | * | 12/2003 | Blake | H05K 7/20209 318/471 |
| 2005/0210896 A1 | * | 9/2005 | Durant | G06F 1/206 62/178 |
| 2008/0317445 A1 | * | 12/2008 | Harashima | H02P 7/29 388/811 |
| 2009/0265045 A1 | * | 10/2009 | Coxe, III | G06F 1/20 700/300 |
| 2015/0005949 A1 | * | 1/2015 | Haridass | G06F 1/206 700/275 |

* cited by examiner

*Primary Examiner* — Kamini S Shah
*Assistant Examiner* — Mohammed Shafayet
(74) *Attorney, Agent, or Firm* — WOMBLE BOND DICKINSON (US) LLP

(57) ABSTRACT

Methods and systems for thermal management of hardware resources are disclosed. To improve the likelihood of the computer implemented services being provided, the systems may include information transmission topologies that are more likely to properly transmit operating point information (e.g., actual fan rates, rates at which fans are to operate, etc.) between management entities such as thermal managers and entities managed by the thermal managers such as fans (and/or other types of gas flow control components). By doing so, the system may be more likely to provide thermal management services as intended by using the transmitted information that is more likely to be accurate.

20 Claims, 10 Drawing Sheets

CURRENT MODE FAN CONTROL AND TACHOMETER REPORTING DESIGN

FIELD OF THE DISCLOSURE

Embodiments disclosed herein generally relate to thermal management. More particularly, embodiments disclosed herein relate to information transmission management for thermal management of devices.

BACKGROUND

Computing devices may store data and used stored data when performing computations. For example, computing devices may utilize data when providing computer implemented services. To provide the computer implemented services, the computing devices may consume electrical power to perform the computations. The consumed electrical power may generate heat.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1:
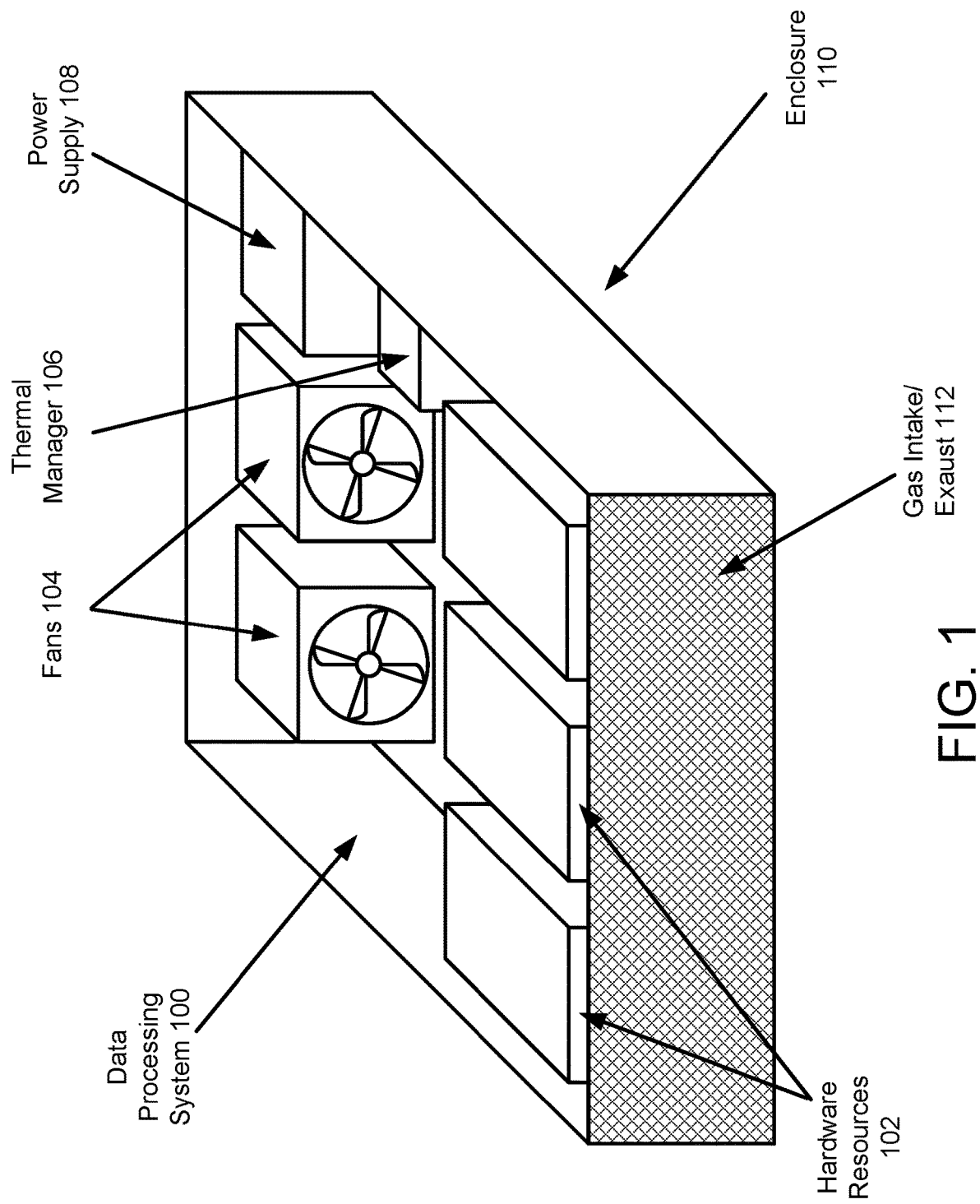
FIG. 1 shows a diagram illustrating a system in accordance with an embodiment.

Various embodiments and aspects of the disclosure will be described with reference to details discussed below, and the accompanying drawings will illustrate the various embodiments. The following description and drawings are illustrative of the embodiments and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments of the invention relate to methods and systems for thermal management of hardware resources that may be used to provide computer implemented services. Specifically, the disclosed thermal management method and systems may improve the likelihood of data processing systems providing desired computer implemented services by improving the thermal management of the hardware resources.

To improve the likelihood of the computer implemented services being provided, the systems may include information transmission topologies that are more likely to properly transmit operating point information (e.g., actual fan rates, rates at which fans are to operate, etc.) between management entities such as thermal managers and entities managed by the thermal managers such as fans (and/or other types of gas flow control components). By doing so, the system may be more likely to provide thermal management services as intended by using the transmitted information that is more likely to be accurate.

To improve the likelihood of information being transmitted accurately, the information transmission topologies may convert voltage signals (which may be used by the management and managed entities) to current signals (which may be used for information transmission purposes). In contrast to the voltage signals which may be negatively impacted (with respect to information transmission capability) by changes in the resistance of various components, the current signals may be independent from the loads presented to the current signal generation components. For example, current mirrors may be used to generate the current signals in a manner that is able to adapted to the time changing resistances in the system such that the magnitudes of the transmitted current may independent of the resistances. Consequently, the transmitted current signals may, in contrast to the voltage signals, may not be subject to voltage level shifting or other issues that may conceal information encoded in voltage signals.

To facilitate information transmission, various pairs of signal converters may be positioned at ends of a transmission path. The signal converters may convert a voltage signal to a current signal at a first end of the transmission path, send the current signal over the transmission path, and convert the current signal into a second voltage signal at a second end of the transmission path. The second voltage signal may be substantially similar to the first voltage signal (or may be converted to a signal interpretable by an entity positioned near the second end of the transmission path). By doing so, voltage signal transmission issues (e.g., such as voltage level shifting) in the transmission path may be avoided.

As used herein, a voltage signal may refer to an electromagnetic signal in which information is encoded in the magnitude of the voltage of the electromagnetic signal. In contrast, a current signal may refer to an electromagnetic signal in which the information is carried in the magnitude of the current of the electromagnetic signal. An electromagnetic signal may include both a voltage and a current.

In an embodiment, a data processing system to provide computer implemented services is provided. The data processing system may include hardware resources used to provide the computer implemented services; a fan adapted to generate a gas flow proximate to the hardware resources for thermal management; a thermal manager adapted to: generate a voltage signal indicating a rate of operation for the fan to implement, and output the voltage signal; an interconnect positioned to operably connect the thermal manager and the fan; a first voltage signal to current signal converter positioned between the thermal manager and the interconnect, and adapted to convert the voltage signal to a first current signal on the interconnect, the first current signal being independent of a load presented to an interconnect side of the first voltage signal to current signal converter; and a second voltage signal to current signal converter positioned between the fan and the interconnect, and adapted to: convert the first current signal to a second voltage signal, and present the second voltage signal to the fan.

The fan may include a connector to the interconnect that presents a variable resistance depending on operation of the fan, the variable resistance causing the load presented to the interconnect side of the first voltage signal to current signal converter to vary depending on the operation of the fan. The variable resistance of the connector may cause voltage level shifting between the fan and the thermal manager.

The independence of the first current signal from the load presented to the interconnect side of the first voltage signal to current signal converter may compensate for the voltage level shifting to cause the second voltage signal to duplicate the first voltage signal.

The first voltage signal to current signal converter may include a current mirror adapted to receive a first current generated with the first voltage signal and output the first current signal to the interconnect.

The second voltage signal to current signal converter may include a voltage divider driven by a direct current voltage source and the first current signal. Driving the voltage divider with the first current signal modulates an output voltage of the voltage divider as the second voltage signal.

The data processing system may also include a third voltage signal to current signal converter positioned between the fan and the interconnect, and adapted to convert a third voltage signal to a second current signal on the interconnect, the second current signal being independent of a second load presented to an interconnect side of the third voltage signal to current signal converter; a fourth voltage signal to current signal converter positioned between the interconnect and the thermal manager, and adapted to: convert the second current signal to a fourth voltage signal, and present the fourth voltage signal to the thermal manager; and a tachometer that generates the third voltage signal based on a rotation rate of the fan.

The third voltage signal to current signal converter may include a current mirror adapted to receive a first current generated with the third voltage signal and output the second current signal to the interconnect. The fourth voltage signal to current signal converter may include a voltage divider driven by a direct current voltage source and the second current signal, wherein driving the voltage divider with the second current signal modulates an output voltage of the voltage divider as the fourth voltage signal.

The data processing system may also include a printed circuit board comprising the interconnect. The fan and at least one of the second voltage signal to current signal converter and the third voltage signal to current signal converter may be packaged as a fan module operably connected to the interconnect a set of contacts of the fan module, the set of contacts manifesting a variable resistance between the fan module and the interconnect.

The thermal manager may include a microcontroller adapted to: manage an operating point of the fan using a pulse width modulation signal encoded on the first voltage signal; and monitor the fan for impairment.

Monitoring the fan for impairment may include converting the fourth voltage signal to a rate of rotation of the fan; making a comparison between the rate of rotation of the fan and an expected rate of rotation of the fan; and determining whether the fan is impaired based on the comparison.

The interconnect may include a first trace over which the first current signal is transmitted and a second trace over which the second current signal is transmitted.

The fan may include a motor and a plurality of blades, the motor being adapted to rotate at different speeds to modify a rate of the gas flow based on the second voltage signal.

In an embodiment, a method of thermally managing a data processing system providing computer implemented services is provided. The method may include generating, by a thermal manager of the data processing system, a voltage signal carrying fan rate information in a magnitude of the voltage signal, the fan rate information indicating a rotation rate for a fan of the data processing system should rotate; converting, by a first voltage signal to current signal converter of the data processing system, the voltage signal to a first current signal; applying, by the first voltage signal to current signal converter, the first current signal to a first side of an interconnect to the fan, the first current signal having a magnitude that is independent of a load presented to an interconnect side of the first voltage signal to current signal converter; generating, by a second voltage signal to current signal converter, a second voltage using the first current signal, the second voltage signal carrying the fan rate information in a magnitude of the second voltage signal; and operating the fan at the rotation rate based on the second voltage signal.

The fan may include a motor and a plurality of blades, the motor being adapted to rotate at different speeds to modify a rate of gas flow based on the second voltage signal, the gas flow being proximate to hardware resources of the data processing system that provide the computer implemented services.

The fan may include contacts that operably connect to the interconnect and introduce a variable resistance in a path of the first current signal, the variable resistance varying depending on the rotation speed of the fan.

In an embodiment, a non-transitory computer readable medium storing instructions that, when executed by a processor, cause a method thermally managing a data processing system providing computer implemented services is provided. The method may be similar to that discussed above.

Turning to FIG. 1, a diagram illustrating a system in accordance with an embodiment is shown. The system shown in FIG. 1 may be used to provide computer implemented services. The system may include, but is not limited to, data processing system 100 and enclosure 110. Each of these components is discussed below.

Data processing system 100 may provide the computer implemented services. When doing so, data processing system 100 may consume electrical power from other sources (e.g., via power supply 108 or another device external to the data processing system, either of which may obtain power from a utility or other source). To provide the computer implemented services, data processing system 100 may include hardware resources 102 and power supply 108.

Hardware resources 102 may include any number of physical devices (e.g., processors, memory modules, storage devices, communications devices, etc.) that provide computing resources (e.g., processor cycles, transitory storage, persistent storage, communications bandwidth, etc.) usable to provide the computer implemented services. The computing resources may be used to support applications (e.g., computing instructions executing with the computing resources) hosted by data processing system 100. The applications may provide the computer implemented services. The computer implemented services may include any type and quantity of computer implemented services such as, for example, database services, data storage services, electronic communications services, etc. Data processing system 100 may provide other types of computer implemented services without departing from embodiments disclosed herein.

When operating, hardware resources 102 may consume electrical power to provide the computing resources used to provide the computer implemented services. The hardware resources may utilize power from power supply 108, and/or other sources. Power supply 108 may include any number of physical devices (e.g., transformers, current/voltage sensors, controllers, etc.) usable to obtain power from other power sources (not shown) and provide conditioned power to hardware resources 102 and/or other components. The power obtained from the other power sources may be any form of power (e.g., alternating current, direct current) but the conditioned power may have specific characteristics (e.g., direct current of a predetermined voltage level) based on the hardware resources 102. For example, hardware resources 102 may not operate as expected when hardware resources 102 are provided with power that is not conditioned power.

Hardware resources 102 may generate heat when providing their functionality. For example, hardware resources 102 may consume power when providing computing resources and generate heat as a byproduct. Generally, hardware resources 102 and/or other components of data processing system 100 may have associated thermal ranges in which the hardware resources 102 are capable of operating (e.g., at high reliability). If the temperatures of various portions of hardware resources 102 fall outside of the thermal ranges, then the corresponding portions of hardware resources 102 may fail to operate (e.g., as intended/expected), may operate with some impairment (e.g., reduced rate, increased error rates in operation, etc.), or may otherwise operate in a manner that may impair (partially or entirely) the ability of data processing system 100 of providing the computer implemented services.

Data processing system 100 may include one or more fans 104 and thermal manager 106 to thermally manage hardware resources 102. Fans 104 may thermally manage hardware resources 102 by selectively generating flows of gas proximate to hardware resources 102 which may allow heat from hardware resources 102 to be removed. Removing heat from hardware resources 102 may cool them. The rate at which heat is removed from hardware resources 102 may depend on the rate of the flow of gas proximate to hardware resources 102.

In an embodiment, fans 104 include functionality to modulate the rate of gas flows generated by their operation. For example, a fan may include a motor (e.g., electric) and one or more blades. The rate at which the blades move gasses thereby generating a gas flow may be dependent on the rotation rate of the motor. The rate of rotation of the motor may depend on the quantities of voltage and current with which fans 104 are driven. In an embodiment, the fans 104 are driven with a pulse width modulated voltage. The duty cycle (e.g., ratio of on to off time during each cycle of the pulse width modulated voltage) of the pulse width modulated voltage may control the rate at which fans 104 rotate (e.g., within certain limitations, fans 104 may rotate at a predetermined maximum rate with a 100% duty cycle and at reduced rates depending on the duty cycle).

To manage the operation of fans 104, fans 104 may include tachometers to report operating points (e.g., rotation rates) to other entities (e.g., thermal manager 106). The tachometers (or other types of sensors) may generate an electrical signal corresponding to the operating points of fans 104. For example, the tachometers generate pulse trains at a rate corresponding to their respective operating points.

Thermal manager 106 may manage the thermal environment of data processing system 100. To do so, thermal manager 106 may (i) collect information regarding temperatures of hardware resources 102 (and/or temperatures of other components), (ii) collect information regarding the operating points of fans 104, and (iii) use the collected information, at least in part, to set the operating points of fans 104. To collect information regarding the operating points of fans 104, thermal manager 106 may receive signals (e.g., electrical signals carried via a bus, interface, etc.) from the tachometers (or other types of operating point reporting devices) of fans 104. The received signals may indicate the operating points of fans 104. To set the operating points of fans 104, thermal manager 106 may output signals (e.g., electrical signals carried via a bus, interface, etc.) to fans 104. The output signals may indicate operating points for fans 104 (which fans 104 may implement).

However, by virtue of the environment (e.g., electromechanical) in which fans 104 and thermal manager 106 operate, the signals from fans 104 and thermal manager 106 may be degraded or changed (e.g., when read by an entity trying to interpret the signals). Further, the degradation or change of the signals caused by the environment may change over time.

For example, consider a scenario where a fan is operably connected to a thermal manager via an interconnect. The fan may be connected to the interconnect via a wire harness, cabling, etc. with contacts. However, the connection between the contacts and the interconnect may be subject to disruption resulting in the generation of an unexpectedly large resistance that may change over time due to mechanical forces generated by the fan. The presence of this resistance (and/or its time changing nature) may cause the voltage levels of the fan and thermal manager to diverge from one another or operate in undesired/unexpected manners. Consequently, signals in which information (e.g., operating point information) is encoded (e.g., in an amplitude of a voltage signal) and transmitted between these components may be subject to change in a manner that conceals the information from a receiving entity or otherwise renders the information unreadable, recoverable, etc.

For example, consider a scenario where a fan generates a voltage signal of a pulse train that varies in magnitude from 0 to 3.3 volts. If the voltage level of a thermal manager is shifted upward by 1 volt, the voltage signal received by the thermal manager may only vary in magnitude from 1 to 3.3 volts. If the thermal manager implements a detection scheme that requires a pulse to vary down to 0.5 or less volts for the pulse to register, then the thermal manager may incorrectly read that no pulses are included in the pulse train (which may indicate that the fan is not rotating) because the voltage of each pulse never drops below 1 volt from the perspective of the thermal manager (and/or signal conditioning circuitry used by the thermal manager to read the pulse train for its encoded information content).

If a thermal manager or fan is unable to appropriately read a signal on which operating point information is encoded, then these components may fail to provide their functionality of managing the thermal environment of the data processing system 100 in a manner consistent with expected operation of the system. For example, if a thermal manager sends a voltage signal to a fan that indicates an operating point, but the fan is unable to read the operating point information encoded in the voltage signal, then the fan may operate as though no signal has been received (which may cause it to operate in accordance with a default operating point which may be not operating at all). In another example, if a thermal manager receives a voltage signal from a fan that indicates the fans operating point, but the thermal manager is unable to read the operating point information included in the voltage signal, then the thermal manager may, for example, believe that the fan is dysfunctional (e.g., if previously instructed to operate at a predetermined operating point), is not operating even when it is operating, etc.

In general, embodiments disclosed herein relate to system, methods, and devices for improving the quality of computer implemented services provided by a data processing system. To do so, the data processing system may include thermal manager 106 and one or more fans 104 that encode operating point information in current signals transmitted between these components. In contrast to voltage signals that may be subject to degradation or other issues (e.g., voltage level shifting) due to unexpected levels and/or changing levels of resistance, the current signals may not be subject to degradation or other issues. The thermal management of hardware resources 102 provided by these components may be improved by improving the likelihood of each of these components receiving the operating point information from the respective components.

Because the operating point information may be used to select how to operate the fan for thermal management purposes, the thermal management of hardware resources 102 may be more likely to meet thermal management needs of hardware resources 102 thereby improving the likelihood of hardware resources 102 being maintained within temperature ranges where the resources operate as expected. Thus, hardware resources 102 may be more likely to provide the computer implemented services by being more likely to operate as expected due to the improved thermal management of these resources.

Enclosure 110 may include a physical structure for housing data processing system 100. The physical structure may be a form factor compliant structure such as, for example, a rack mount enclosure for a server. The physical structure may be other types of structures for housing data processing systems without departing from embodiments disclosed herein.

Enclosure 110 may include any number of sub-enclosures such as, for example, server chassis sleds, internal blocks, and/or other structures in which various portions of hardware resources 102 are positioned. The fans 104 may be positioned in enclosure 110 to generate predetermined flows of gasses when the fans operate 104 such that the gasses, at least in part, flow by hardware resources 102. Enclosure 110 may include one or more of gas intake/exhaust 112 which may allow gasses to traverse through it. For example, a gas intake or exhaust may be implemented with a hole through enclosure 110. The hole may be entirely or partially covered with a grill, mesh, or other structure which may allow gasses to flow through the intake/exhaust while preventing objects of significant size from moving through the intake/exhaust. Fans 104 may be positioned with respect to the intake and/or exhaust on enclosure 110 to facilitate gas flow through (e.g., in an intake and/or out of an exhaust) of enclosure 110. In this manner, cool gases may be brought into enclosure 110 and heated gases may be exhausted from enclosure 110.

While the system of FIG. 1 has been illustrated as including a limited number of specific components, a system may include different numbers, types, and/or quantities of components without departing from the embodiments disclosed herein.

Figure 2A:
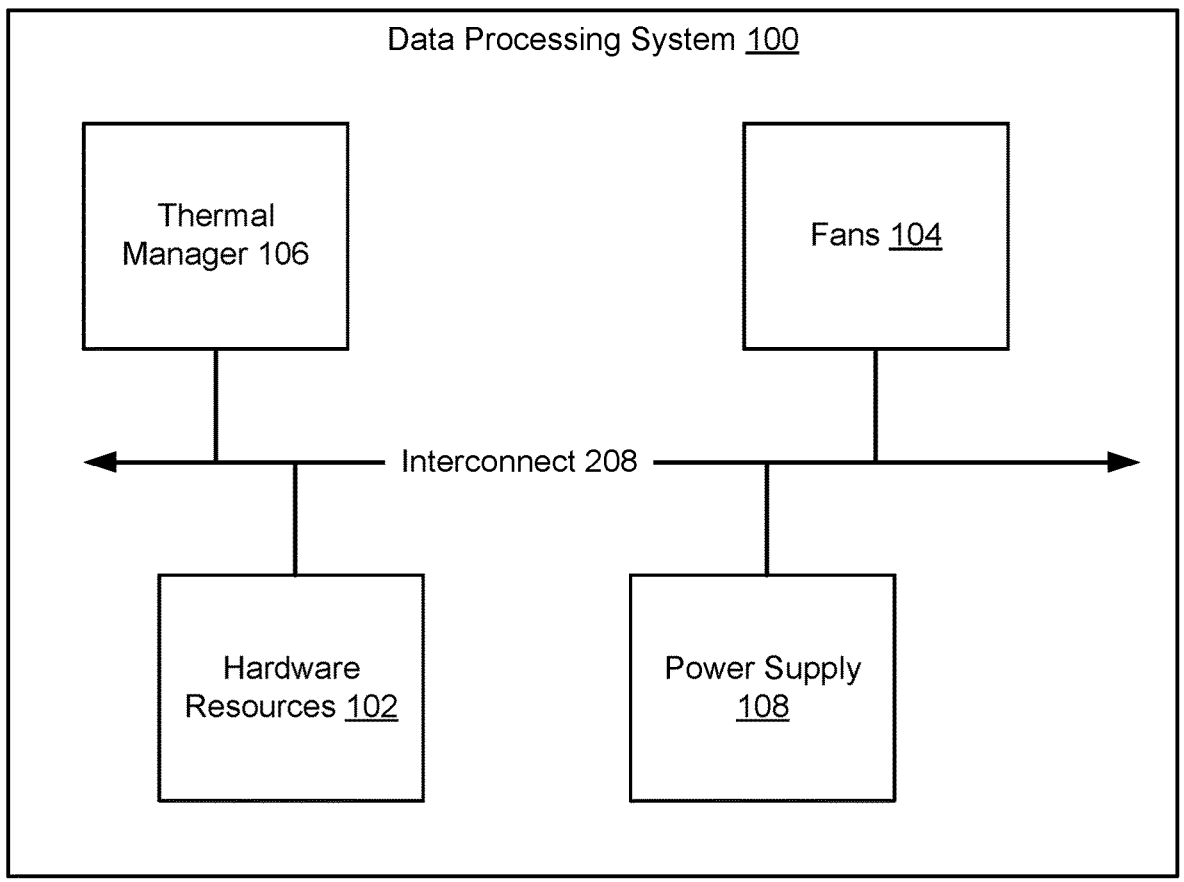
FIG. 2A shows a block diagram illustrating a data processing system in accordance with an embodiment.

Turning to FIG. 2A, a block diagram of the system shown in FIG. 1 in accordance with an embodiment is shown. As discussed above, embodiments disclosed herein may improve the likelihood of a data processing system providing computer implemented services by improving the thermal management of the components of the data processing system that provide the computer implemented services.

To provide the computer implemented services, data processing system 100 may include hardware resources 102 and power supply 108. The power supply 108 may be capable of supplying power to hardware resources 102 so that hardware resources 102 may provide the computer implemented services through their operation. However, hardware resources 102 may generate heat which may need to be removed to maintain the temperature of these resources within certain limitations (e.g., which may be component dependent).

To manage the heat generated by hardware resources 102, data processing system 100 may include thermal manager 106 and fans 104. Each of these components is discussed below.

Thermal manager 106 may provide thermal management services. The thermal management services may include (i) obtaining information (e.g., thermal) regarding hardware resources 102, (ii) obtaining information regarding the operating point of one or more of fans 104, and/or (iii) setting the operating point of one or more of fans 104 based, at least in part, on the obtained information.

In an embodiment, thermal manager 106 is implemented with a computing device such as a host or server, a personal computer (e.g., desktops, laptops, and tablets), a "thin" client, a personal digital assistant (PDA), a Web enabled appliance, an embedded computing device, a mobile phone (e.g., Smartphone), and/or any other type of data processing device or system. In an embodiment, thermal manager 106 is implemented using a chassis controller. A chassis controller may be a computing device positioned with a chassis (e.g., an enclosure in which data processing system 100 is positioned), that is operably connected to data processing system 100 (e.g., via a bus or interconnect), and that may operate independently from data processing system 100. For example, the chassis controller may be implemented with an out of band management controller or other type of computing device. For additional details regarding computing devices, refer to FIG. 4.

To manage the operation of fans 104, thermal manager 106 may transmit information to and receiving information from fans 104. The information may indicate the actual operating point of one or more of fans 104 and/or the intended operating points for the one or more fans 104 (e.g., the intended operating points being selected by thermal manager 106 for thermal management purposes).

Figure 2B:
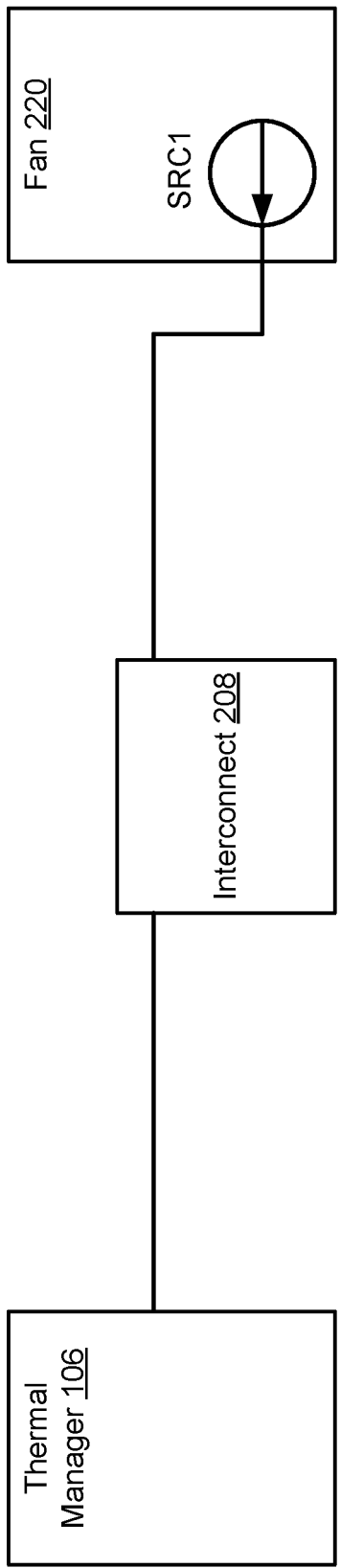
FIG. 2B shows a block diagram illustrating a first topology in accordance with an embodiment.

In an embodiment, the information is encoded on current signals transmitted between fans 104 and thermal manager 106. To do so, these components may include functionality to generate current signals corresponding to the operating point information. For example, these components may include current sources that are capable of generating desired quantities of current which may be used to transmit the operating point information to the other components. Refer to FIG. 2B for an example circuit topology.

In an embodiment, the information is initially encoded in the amplitude of voltage signals. However, as part of the signal transmission between these components (e.g., via interconnect 208), the voltage signals may be converted to current signals (with the information encoded in the magnitude of the currents) and then converted back to voltage signals. Refer to FIGS. 2C-2G for additional details regarding the aforementioned process.

Interconnect 208 may include one or more physical devices for operably connecting components of data processing system 100. Interconnect 208 may include, for example, a power bus over which power supply 108 provides conditioned power to hardware resources 102 and/or other components. Interconnect 208 may include any number of data buses (analog and/or digital) over which data is sent between the components of data processing system 100. For example, the current signals between thermal manager 106 and fans 104 may be transmitted over a bus. All or a portion of interconnect 208 may be implemented with, for example, a circuit card/board. The circuit card may include traces that allow current signals to be transmitted between thermal manager 106 and fans 104. Multiple traces may be employed to allow for bidirectional transmission of operating point information at the same time.

While the system of FIG. 2A has been illustrated as including a limited number of specific components, a system may include different numbers, types, and/or quantities of components without departing from the embodiments disclosed herein.

Turning to FIG. 2B, a block diagram of a communication topology in accordance with an embodiment is shown. In FIG. 2B, fan 220 is managed by thermal manager 106. To manage fan 220, thermal manager 106 may obtain operating point information from fan 220. However, by virtue of the separate of these components, the information may need to be transmitted over interconnect 208 which may be problematic for voltage signals.

In an embodiment, fan 220 includes functionality to output a current signal having a magnitude corresponding to an operating point (e.g., rotation rate of fan 220) for fan 220. To provide the current signal, fan 220 may include a current source SRC1. Current source SRC1 may be coupled to a sensor or other device that monitors the operating point of fan 220. Based on information obtained from the sensor, current source SRC1 may generate a current signal corresponding to the operating point of fan 220. The current generated by current source SRC1 may be output at a first end of interconnect 208, transmitted to a second end of interconnect 208, and received by thermal manager 106. Once received, thermal manager 106 may read the current signal to identify the operating point of fan 220.

While not illustrated in FIG. 2B, thermal manager 106 may implement a similar process for communicating the desired operating point for fan 220. Consequently, fan 220 and/or thermal manager 106 may each include or may be operably connected to current sources usable to generate current signals that may be used to communicate operating point information.

Figure 2C:
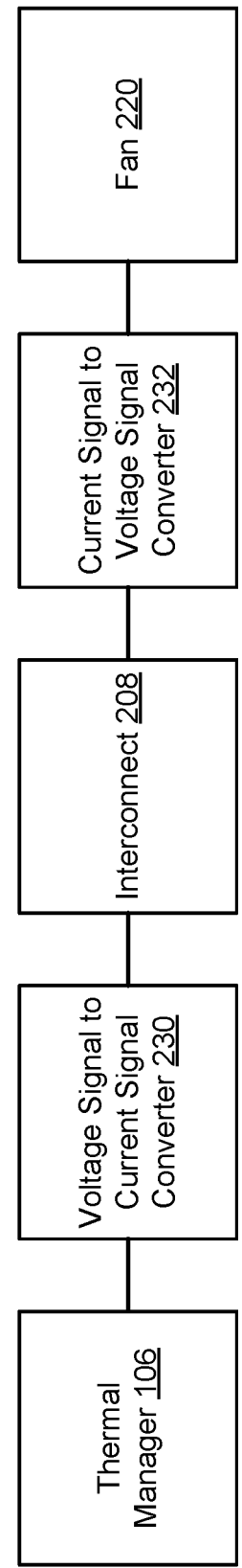
FIG. 2C shows a block diagram illustrating a second topology in accordance with an embodiment.

Turning to FIG. 2C, a block diagram of a communication topology in accordance with an embodiment is shown. In FIG. 2C, like FIG. 2B, fan 220 is managed by thermal manager 106.

To manage fan 220, thermal manager 106 includes functionality to (i) output a voltage signal having a magnitude corresponding to an operating point (e.g., rotation rate of fan 220) for fan 220 and (ii) read a second voltage signal, from fan 220, indicating the actual operating point of fan 220. Fan 220 and thermal manager 106 may be separated from one another physically. To transmit the information encoded in the voltage signals, interconnect 208 may be utilized.

Prior to transmission, the voltage signals may be converted to current signals with voltage signal to current signal converter 230 and converted back to a voltage signal with current signal to voltage signal converter 232. In contrast to voltage signals which may be concealed by changes in voltage level due to resistances between various portions of the communication topology, the current signals may be independent (e.g., have magnitudes that are not impacted by) from the resistances presented to an interconnect side of the respective converters 230, 232. By being independent, changes in voltage level due to resistance in the transmission path may not result in the current signals being concealed from a receiving entity.

For example, in an embodiment, at least one of converters 230, 232 is implemented with a current mirror. The current mirror may be driven using the voltage signal generated by thermal manager 106 or fan 220. Consequently, regardless of a load presented to an interconnect side of the converter, the current mirror of the converter may draw a quantity of current through interconnect 208 that is the same as that driven into the input of the current mirror by virtue of application of the voltage signal.

In another example, in an embodiment, at least one of converters 230, 232 is implemented with a voltage divider. The voltage divider may be driven by the current signal and a nominal voltage source. When driven, the voltage divider may output a second voltage signal that replicates the information content of the voltage signal that drives the current mirror.

In an embodiment, pairs of current mirrors and voltage dividers are used to unidirectional transmit operating point information between thermal manager 106 and fan 220. Different sets (e.g., two pairs) of the pairs may be utilized to allow a thermal manager and a fan to transmit (bidirectional) operating point information between them.

By doing so, unexpected and/or time changing variations in resistance of the transmission path may be compensated for when transmitting operating point information. For example, contact resistances that may vary due to the mechanical motion of a fan may be mitigated with respect to the transmission of operating point information by virtue of the use of current signals to transmit the information over the communication topology.

Figure 2D:
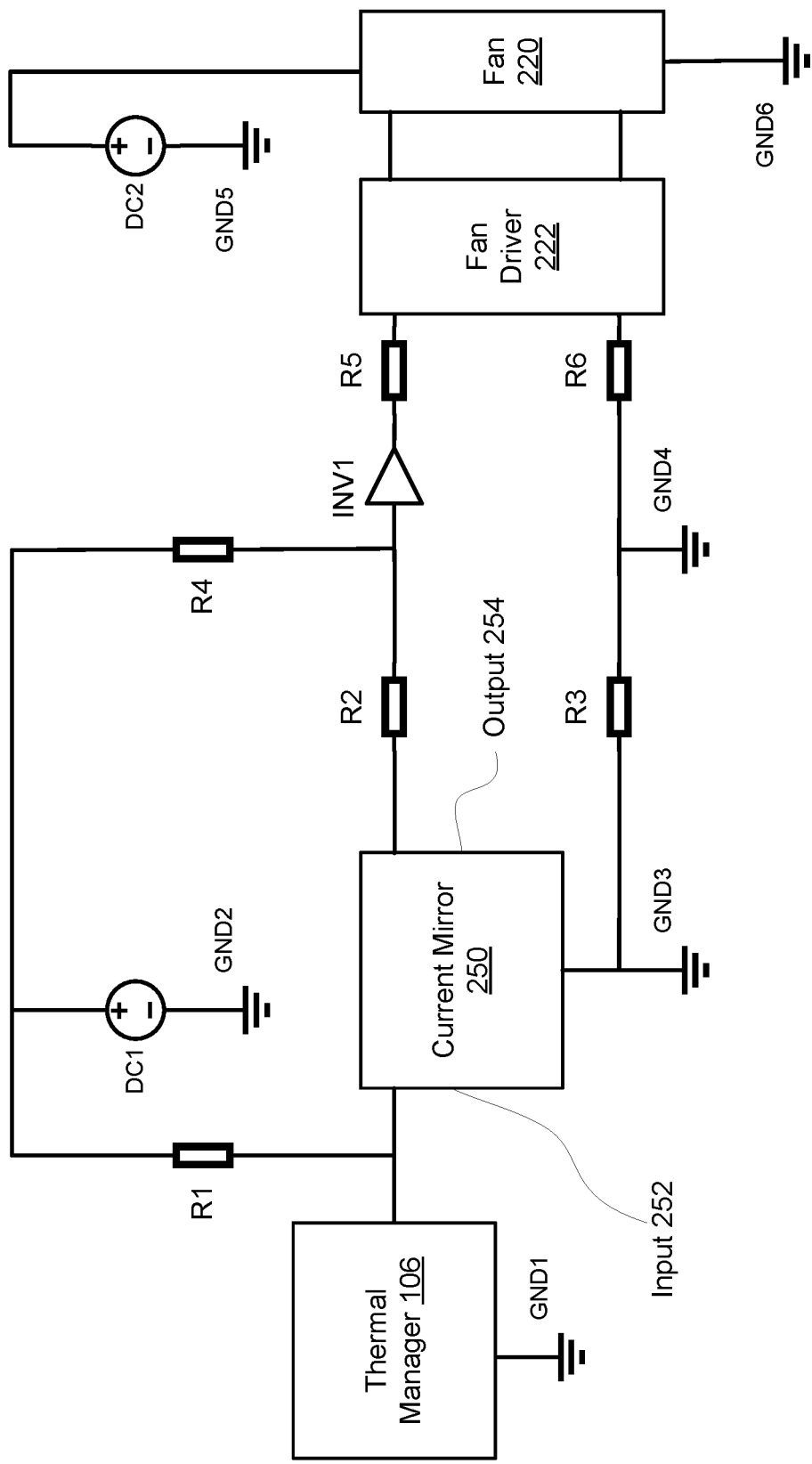
FIG. 2D shows a circuit diagram illustrating a first circuit for managing fan operation in accordance with an embodiment.

To further clarify embodiments disclosed herein, FIGS. 2D-3G show circuit diagrams of communication topologies in accordance with embodiments disclosed herein. FIGS. 2D-2E may illustrate topologies usable to transmit operating point information from a thermal manager to a fan while FIG. 2F may illustrate a topology usable to transmit operating point information from a fan to a thermal manager (one or more of the topologies may be implemented into a data processing system). Lastly, FIG. 3F may illustrate a circuit diagram of a current mirror in accordance with an embodiment.

Turning to FIG. 2D, a circuit diagram illustrating a first topology in accordance with an embodiment is shown. The topology may allow thermal manager 106 to transmit operating point information to fan 220.

In this topology, thermal manager 106 may output a voltage signal. The voltage signal may be implemented with a pulse width modulated signal that indicates the operating point at which fan 220 is to operate. For example, the voltage signal may be a pulse width modulation signal having a duty cycle that represents the operating point of fan 220. The pulse width modulation signal may have a maximum voltage. The duty cycle may be a ratio of on to off time (e.g., of the voltage over a cycle) or a ratio of off to on time.

Direct current source DC1 may output a predetermined direct current voltage level (e.g., 5 volts or another value). Pull up resistor R1 may be connected to input 252 of current mirror 250 thereby causing a quantity of current (in the absence of the voltage signal from thermal manager 106) to be driven into input 252 of current mirror 250. This quantity of current may be set by changing the values of direct current source DC1 and resistor R1. When a voltage signal is output by thermal manager 106, the quantity of current directed into the input of current mirror 250 may be modulated (e.g., reduced). If the voltage signal has a maximum magnitude which is the same as that output by direct current source DC1, then no current may flow into input 252 while the voltage signal is at its maximum. Consequently, the current driven into input 252 may be inverse to the voltage signal output by thermal manager 106 (e.g., when voltage signal is high, no current may be driven into input 252 while the maximum current may be driven into input 252 when the voltage signal is low).

Output of current mirror 250 may be operably connected to an interconnect between thermal manager 106 and fan 220. In a scenario where the interconnect is implemented with a circuit, a trace and ground conductors from the circuit card may be used as the interconnect. However, the trace may have a resistance R2 and the ground conductor may have a resistance R3, which may depend on the form of the conductors.

Current mirror 250 may mirror the current received on input 252 with output 254. Consequently, when current is driven into input 252, current may be pulled into output 254 through the resistor R2 at the same rate as the current drive into input 252. Because the current drawn into output 254 is unaffected by the load presented to the interconnect side of current mirror 250, the variable resistances R2 and R3 may be compensated for through the independence of the current signal driven through the interconnect.

At a second end of the interconnect (e.g., away from output 254 of current mirror 250), a voltage division circuit and/or inverter INV1 may be positioned (e.g., a second voltage signal to current signal converter). The voltage divider circuit may convert the current signal to a second voltage signal. To do so, the voltage divider circuit may include a voltage source (e.g., direct current source DC1 or another source) and resister R4 which may be connected to the second end of the interconnect. Consequently, the magnitude of the current driven into input 252 may modulate the voltage output at the input to inverter INV1 as the second voltage signal.

In some embodiments, inverter may not be present and the output voltage may be presented to a package including fan 220. In such scenarios, thermal manager 106 may logically generate an inverted voltage signal so that the second voltage signal will represent the actual voltage signal to be presented to the fan package.

In an embodiment, inverter INV1 inverts the second voltage signal so that the second voltage signal replicates the first voltage signal output by thermal manager 106 (e.g., without having thermal manager 106 logically invert the first voltage signal used to drive current mirror 250).

In an embodiment, the voltage divider and inverter INV1 are positioned with the circuit card that forms the interconnect to current mirror 250. Consequently, contacts from a fan package that includes fan 220, fan driver 222, and/or other components may connect to the output of inverter INV1. In this topology, resistors R5 and R6 may represent the resistance of the contacts, wiring harness, and/or other features of the package that includes fan 220 and fan driver 222.

The second voltage signal may be applied to fan driver 222 which may drive current through fan 220 causing it to operate. In an embodiment, fan driver 222 may include one or more signal conditioning components such as a comparator (e.g., which may compare the second voltage signal to a reference voltage such as 1.25 Volts or whatever voltage level is being used). The signal conditioning components may generate a pulse width modulated voltage signal based on the second voltage signal to improve the fidelity of the voltage signal which carries the operating point information.

The driver may also include power components such as a Darlington pair. The Darlington pair may control the rate at which current flows through windings of fan 220 (e.g., driven by direct voltage source DC2). The output of the signal conditioning components may be used to drive the Darlington pair thereby causing current to flow through the windings of fan 220 in accordance with the signal conditioned second voltage signal.

In some embodiments, fan driver 222 does not include any signal conditioning components. For example, the output of the voltage divider or inverter INV1 may be used to directly power components such as a Darlington pair.

In an embodiment, fan driver 222 also includes one or more protection components such as a diode positioned to prevent a reverse current flow from flowing through fan or otherwise reduce mechanical stress on fan 220 due to rapid changes in current flows.

Thus, in FIG. 2D, the direct current voltage source DC1, resistor R1, and current mirror 250 may be used to implement a first voltage signal to current signal converter. Likewise, direct current voltage source DC1 and resistor R4 may be used to implement a second voltage signal to current signal converter.

In an embodiment, thermal manager 106, resistor R1, current mirror 250, the interconnect (e.g., represented by R2 & R3), and voltage divider (e.g., resistor R4) may be positioned on a circuit card (e.g., a motherboard of a data processing system). In contrast, fan 220 and fan driver 222 may be separately packaged and may be operably (e.g., electrically) connected to the interconnect with a wire harness or other connection method.

However, in FIG. 2D, the resistances of the wiring harness/contact resistances represented by resistors R5 and R6 may still impact the fidelity of the voltage signal presented to fan driver 222. To address this scenario, in some embodiments, the voltage divider and/or inverter INV1 may be packaged with the fan package rather than the circuit card.

Figure 2E:
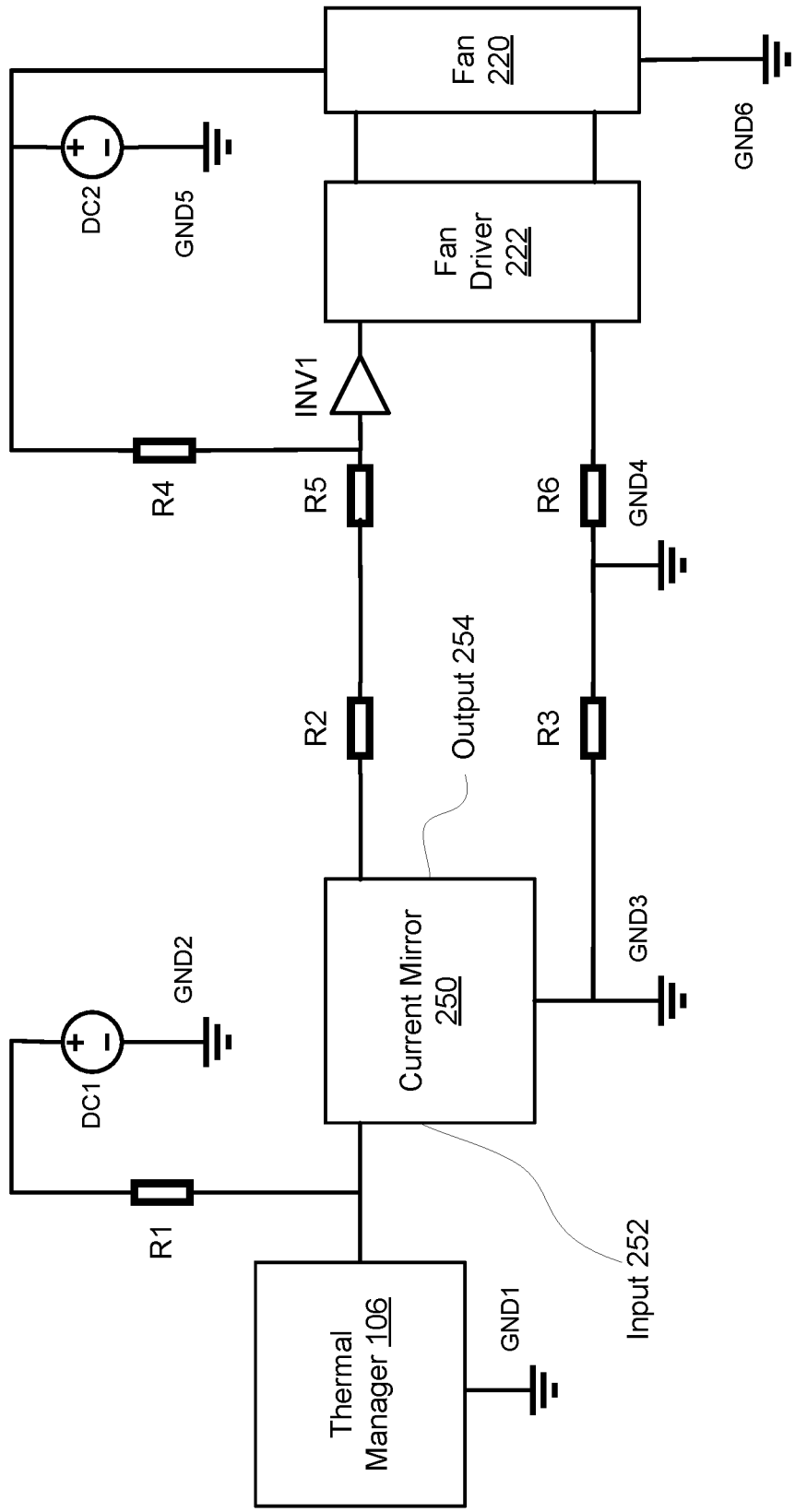
FIG. 2E shows a circuit diagram illustrating a second circuit for managing fan operation in accordance with an embodiment.

Turning to FIG. 2E, a circuit diagram illustrating a second topology in accordance with an embodiment is shown. The second topology may be similar to the first topology. However, in contrast to the first topology, the position of resistances R5 and R6 are changed, and the voltage divider circuit is being driven with the direct current voltage source DC2 which is available to the fan package.

The change in the position of resistances R5 and R6 reflect that inverter INV1 and the voltage divider are now packaged with the fan package, thereby placing the wire harness and contacts between the interconnect and these components.

The voltage divider may be driven by the direct current voltage source DC2, which is used to power the fan module. However, because the direct current voltage sources DC1 and DC2 may be at different voltage levels, the values of resistors R1 and R2 may need to be adjusted so that the voltage divider outputs a second voltage signal that is appropriately scaled.

By packaging the voltage divider and inverter INV1 with the fan package, the effects of variable resistances R5 and R6 may be further mitigated.

While illustrated in FIGS. 2E and 2D with respect to a current mirror for current signal generation, other types of circuit topologies for current signal generation may be used without departing from embodiments disclosed herein.

Thus, using the topologies illustrated in and described with respect to FIGS. 2E and 2D, current signals may be utilized to remove the impacts of variable resistance on transmission of operating point information.

While the topologies shown in and described with respect to FIGS. 2E and 2D have been illustrated and described with respect to specific arrangements of components, the topologies may include additional, different, and/or other components without departing from embodiments disclosed herein.

Figure 2F:
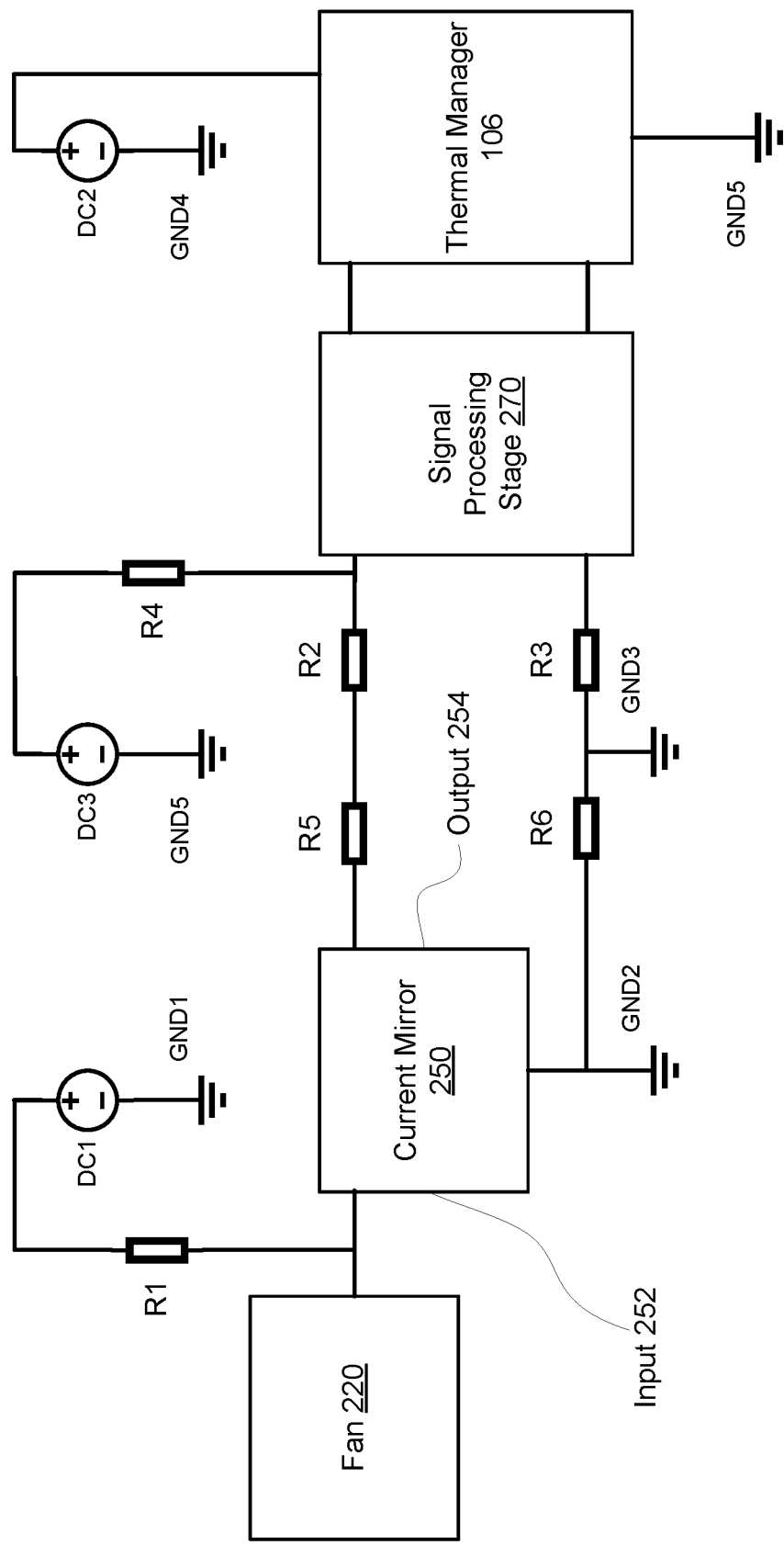
FIG. 2F shows a circuit diagram illustrating a third circuit for collecting fan rate information in accordance with an embodiment.

Turning to FIG. 2F, a circuit diagram of a third topology in accordance with an embodiment is shown. The third topology may facilitate transmission of operating point information from fan 220 to thermal manager 106.

In the third topology, fan 220 may include a tachometer or other device that outputs a voltage representative of the operating point of fan 220. The output may be treated as a first voltage signal, as described with respect to FIGS. 2D-2E. The first voltage signal may be used to drive input 252 of current mirror 250 thereby causing a current signal directed into output 254 to be generated.

In contrast to the topologies of FIGS. 2D-2E, current mirror 250 and resistor R1 may be packaged with the fan package. Consequently, representation resistances R5, R6 may be positioned between current mirror 250 and representations resistances R2, R3 (e.g., of the interconnect). Consequently, the current signal may flow through R4, R2, and R5 into output 254 of current mirror 250.

Like the topologies shown in FIGS. 2D-2E, resistor R4 may be part of a voltage divider that outputs a voltage (e.g., at the node between R2 and R4) as the second voltage signal to a signal processing stage 270.

Due to the high rate of rotation of fan 220, the corresponding voltage and current signals present may include considerable noise (e.g., due to non-ideal behavior of the physical structures represented by the circuit diagram shown in FIG. 2F). To improve the fidelity of the second voltage signal, the second voltage signal may be, for example, filtered (e.g., low pass filtered), processed for over voltage protection purposes, and conditioned using a comparator, as described with respect to FIGS. 2D-2E, to improve the duplication of the second voltage signal by the first voltage signal. Consequently, when the conditioned second voltage signal is received by thermal manager 106, it may be read at a high level of fidelity.

While illustrated in FIG. 2F with respect to a current mirror for current signal generation, other types of circuit topologies for current signal generation may be used without departing from embodiments disclosed herein.

Thus, using the topology illustrated in and described with respect to FIG. 2F, current signals may be utilized to remove the impacts of variable resistance on transmission of operating point information from fan 220 to thermal manager 106.

Figure 2G:
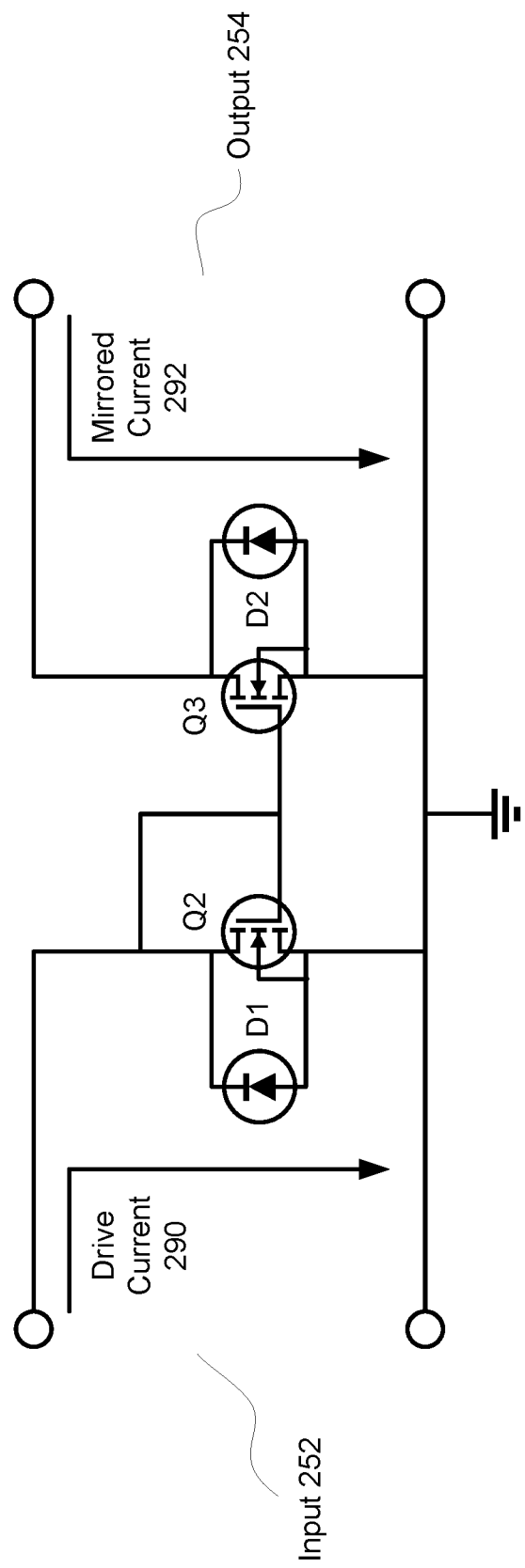
FIG. 2G shows a circuit diagram illustrating a current mirror circuit in accordance with an embodiment.

Turning to FIG. 2G, a diagram of a current mirror in accordance with an embodiment is shown. The current mirror may include input 252 and output 254 (e.g., device terminals). Generally, the current mirror may be capable of replicating drive current 290 with mirrored current 292. For example, when drive current 290 is 1 milliamp, mirrored current 292 (directed into output 254) may also be 1 milliamp. The mirrored current may be independent (substantially independent, some load conditions presented to output 254 may prevent the current mirror from properly mirroring drive current 290 with mirrored current 292) of the load presented to output 254 of the current mirror. Consequently, the current mirror may automatically adapt to changing impedances presented to output 254.

To provide its functionality, the current mirror may include a pair of transistors Q2 and Q3. Transistors Q2, Q3 may be implemented with, for example, metal oxide semiconductor field effect transistor (MosFET) devices. The gates of transistors Q2, Q3 may be connected to each other and/or may also connected to a source of transistor Q2 on the input 252 side of the current mirror. The drains of transistors Q2, Q3 may be grounded. Additionally, diodes D1, D2 may be connected from the drain (bottom node of each transistor in FIG. 2G) to the source (top node of each transistor) of each of the transistors Q2, Q3, and may be part of the respective current mirror package. For example, diodes D1, D2 may be the body diodes of the respective transistors. When so connected, driver current 290 may be replicated on output 254 of the current mirror (e.g., within certain limitations related to a range of input current and a range of resistances presented to output 254).

While illustrated in FIG. 2G as including specific components in specific arrangements, a current mirror in accordance with an embodiment may be implemented using additional, fewer, and/or different components without departing from embodiments disclosed herein and/or may be arranged different than as illustrated in FIG. 2G.

Any of the voltage signal to current signal converters illustrated and described in this disclosure may be implemented with a current mirror, as shown in and discussed with respect to FIG. 2G or with other topologies from that shown in FIG. 2G.

Figure 3A:
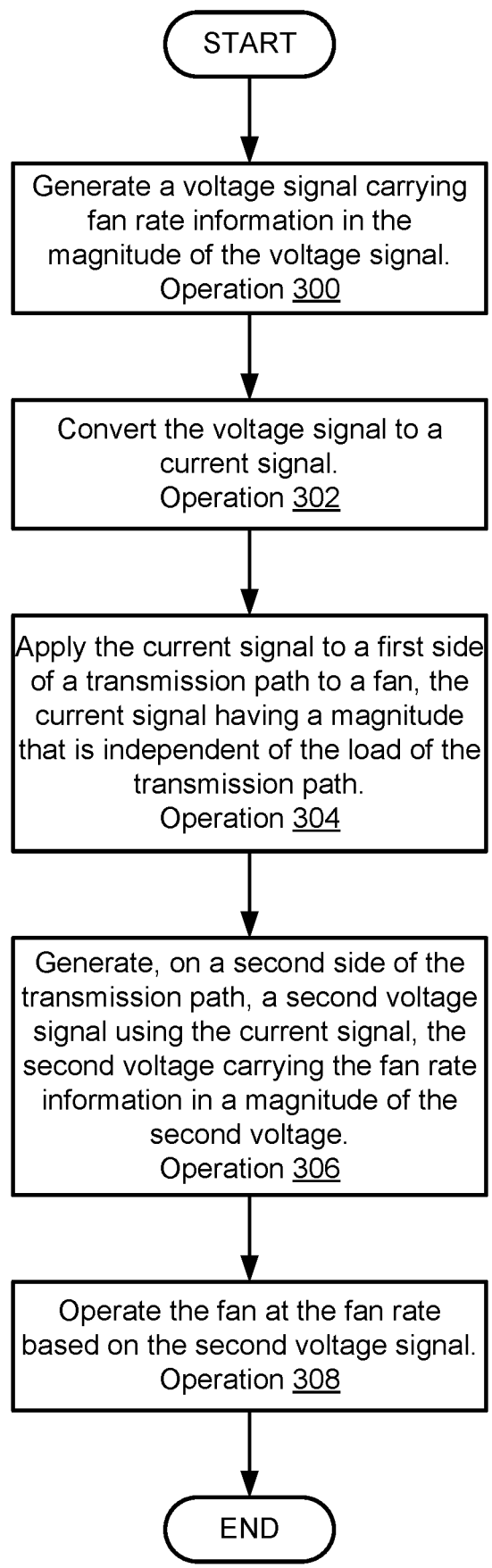
FIG. 3A shows a flow diagram illustrating a method of managing fan operation in accordance with an embodiment.
Figure 3B:
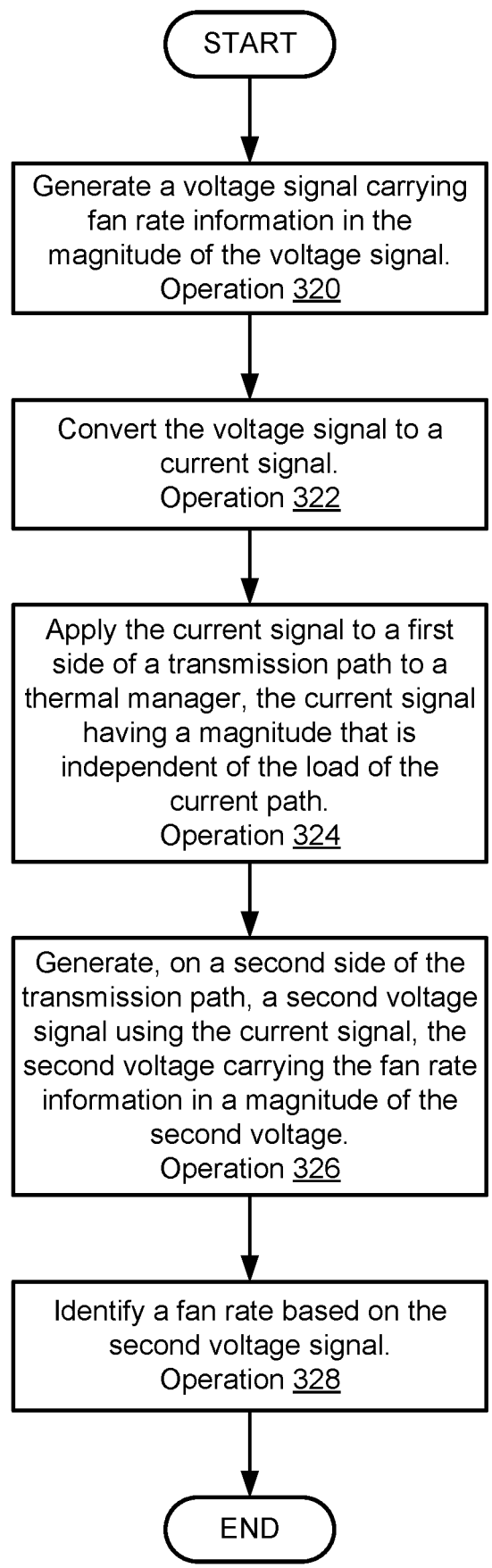
FIG. 3B shows a flow diagram illustrating a method of obtaining fan rate information in accordance with an embodiment.

As discussed above, the components of FIG. 1 may perform various methods to manage heat in a data processing system. FIGS. 3A-3B illustrate examples of methods that may be performed by the components of FIG. 1. In the diagrams discussed below and shown in FIGS. 3A-3B, any of the operations may be repeated, performed in different orders, and/or performed in parallel with or a partially overlapping in time manner with other operations.

Turning to FIG. 3A, a flow diagram illustrating a method of operating a fan for thermal management purposes in accordance with an embodiment is shown. The method may be performed, for example, when a data processing system is providing computer implemented services. The data processing system may perform the method.

At operation 300, a voltage signal carrying fan rate information is the magnitude of the voltage signal is generated. The voltage signal may be generated by, for example, a thermal manager. For example, the thermal manager may include an analog output through which it may output a voltage signal of various voltage levels. The voltage level of the voltage signal may be modulated by the thermal manager to encode the fan rate information in the voltage signal.

In an embodiment, the voltage signal is a pulse width modulated signal where the fan rate information is encoded in the duty cycle of the pulse width modulated signal. The duty cycle may correspond to all, or a portion, of a range of operation of the fan.

At operation 302, the voltage signal is converted to a current signal. The voltage signal may be converted to the current signal using a voltage signal to current signal converter. For example, the voltage signal may be used to generate a current which may be used to drive a current mirror. The output current of the current mirror may be the current signal. The output of the current mirror may be substantially insensitive (e.g., independent from) to the load presented to it at its output terminals. Consequently, variable loads presented to the output of the current mirror may be less likely to disrupt interpretation of the fan rate information encoded in the current signal.

In an embodiment, the fan rate information is encoded in the magnitude of the current signal. By doing so, time changing resistance levels on an output side of the voltage signal to current signal converter may be less likely to conceal or otherwise limit the ability of downstream components (such as a fan) from accurately reading and/or interpreting the fan rate information encoded in the current signal.

At operation 304, the current signal is applied to a first side of a transmission path to a fan. The transmission path may be, for example, a circuit card including traces, ground planes, and/or other structures to which a wire harness of the fan is electrically connected. The current signal may include a magnitude that is independent of the load presented to the output of the voltage signal to current signal converter. Consequently, the information carried by the magnitude of the current signal may not be subject to degradation due to changing load conditions that may otherwise cause information carried in the magnitude of voltage signals to be concealed, degraded, or otherwise be made inaccessible/unreadable.

At operation 306, a second voltage signal is generated using the current signal. The second voltage signal may be generated on a second side of the transmission path over which the current signal traversed. The second side of the transmission path may be operably connected to a second voltage signal to current signal converter. However, the second voltage signal to current signal converter may be adapted to convert the current signal to the second voltage signal. For example, the second voltage signal to current signal converter may include a voltage divider driven by the current signal. The output of the voltage divider may be the second voltage signal upon which the fan rate information is encoded in its magnitude.

At operation 308, the fan is operated based on the second voltage signal. For example, the second voltage signal may be used to drive a fan drive unit/circuit which may cause the fan to operate at operating points based on the fan rate information. For example, a fan drive signal may be generated that causes the fan to spin at a rate specified by the fan rate information. The fan drive signal may, for example, be a pulse width modulated electric signal having magnitude and current at levels necessary to cause the fan to rotate in accordance with the fan rate information.

The method may end following operation 308.

Turning to FIG. 3B, a flow diagram illustrating a method of reading a rate of a fan for thermal management purposes in accordance with an embodiment is shown. The method may be performed, for example, when a data processing system is providing computer implemented services. The data processing system may perform the method.

At operation 320, a voltage signal carrying fan rate information is the magnitude of the voltage signal is generated. The voltage signal may be generated by, for example, a tachometer of a fan. The output of the tachometer may be used (or may be used to drive an electric circuit that generates) to generate the voltage signal. The voltage level of the voltage signal may be modulated by the tachometer to encode the fan rate information in the voltage signal.

In an embodiment, the voltage signal is a pulse train where the fan rate information is encoded in the rate of pulses in the pulse train. Higher pulse rates may indicate higher operating points of the fan. The fan rate information may be encoded using other encoding schemed without departing from embodiments disclosed herein.

At operation 322, the voltage signal is converted to a current signal. The voltage signal may be converted to the current signal using a voltage signal to current signal converter. For example, the voltage signal may be used to generate a current which may be used to drive a current mirror. The output current of the current mirror may be the current signal. The output of the current mirror may be substantially insensitive (e.g., independent from) to the load presented to it at its output terminals. Consequently, variable loads presented to the output of the current mirror may be less likely to disrupt interpretation of the fan rate information encoded in the current signal.

In an embodiment, the fan rate information is encoded in the magnitude of the current signal. By doing so, time changing resistance levels on an output side of the voltage signal to current signal converter may be less likely to conceal or otherwise limit the ability of downstream components (such as a thermal manager) from accurately reading and/or interpreting the fan rate information encoded in the current signal.

At operation 324, the current signal is applied to a first side of a transmission path to a thermal manager. The transmission path may be, for example, a circuit card including traces, ground planes, and/or other structures to which a wire harness of the fan is electrically connected. The current signal may include a magnitude that is independent of the load presented to the output of the voltage signal to current signal converter. Consequently, the information carried by the magnitude of the current signal may not be subject to degradation due to changing load conditions that may otherwise cause information carried in the magnitude of voltage signals to be concealed, degraded, or otherwise be made inaccessible/unreadable.

At operation 326, a second voltage signal is generated using the current signal. The second voltage signal may be generated on a second side of the transmission path over which the current signal traversed. The second side of the transmission path may be operably connected to a second voltage signal to current signal converter. However, the second voltage signal to current signal converter may be adapted to convert the current signal to the second voltage signal. For example, the second voltage signal to current signal converter may include a voltage divider driven by the current signal. The output of the voltage divider may be the second voltage signal upon which the fan rate information is encoded in its magnitude.

At operation 328, the fan rate (e.g., operating point) of the fan is identified based on the second voltage signal. For example, the second voltage signal may be read by the thermal manager (e.g., directly or via one or more preconditioning circuits). The thermal manager may include an analog to digital converter which allows the analog second voltage signal to be interpreted by the thermal manager as a digital value. The digital value may be used to lookup the operating point of the fan (e.g., from a lookup table that associates the fan rate information or read voltages with operating point of the fan).

Once the fan rate is identified, the thermal manager may take action by, for example, (i) modifying the electric signals applied to drive the fan (e.g., in a case where the fan is not operating as expected) to modify its operation, (ii) storing historic information regarding operation of the fan, (iii) reporting the fan rate to other entities, (iv) modifying the operating point of other thermal management components such as fans or otherwise modifying the manner in which a data processing system is being thermally managed, and/or (iv) performing other actions that may facilitate thermal management of a data processing system.

The method may end following operation 328.

Using the methods illustrated in FIGS. 3A-3B, embodiments disclosed herein may provide for improved thermal management of a data processing system by reducing the likelihood of information regarding the operation of various components being rendered unreadable or otherwise misinterpreted. Consequently, the data processing system may be more likely to operate in an expected manner thereby thermally managing the hardware resources that provide computer implemented services.

Figure 4:
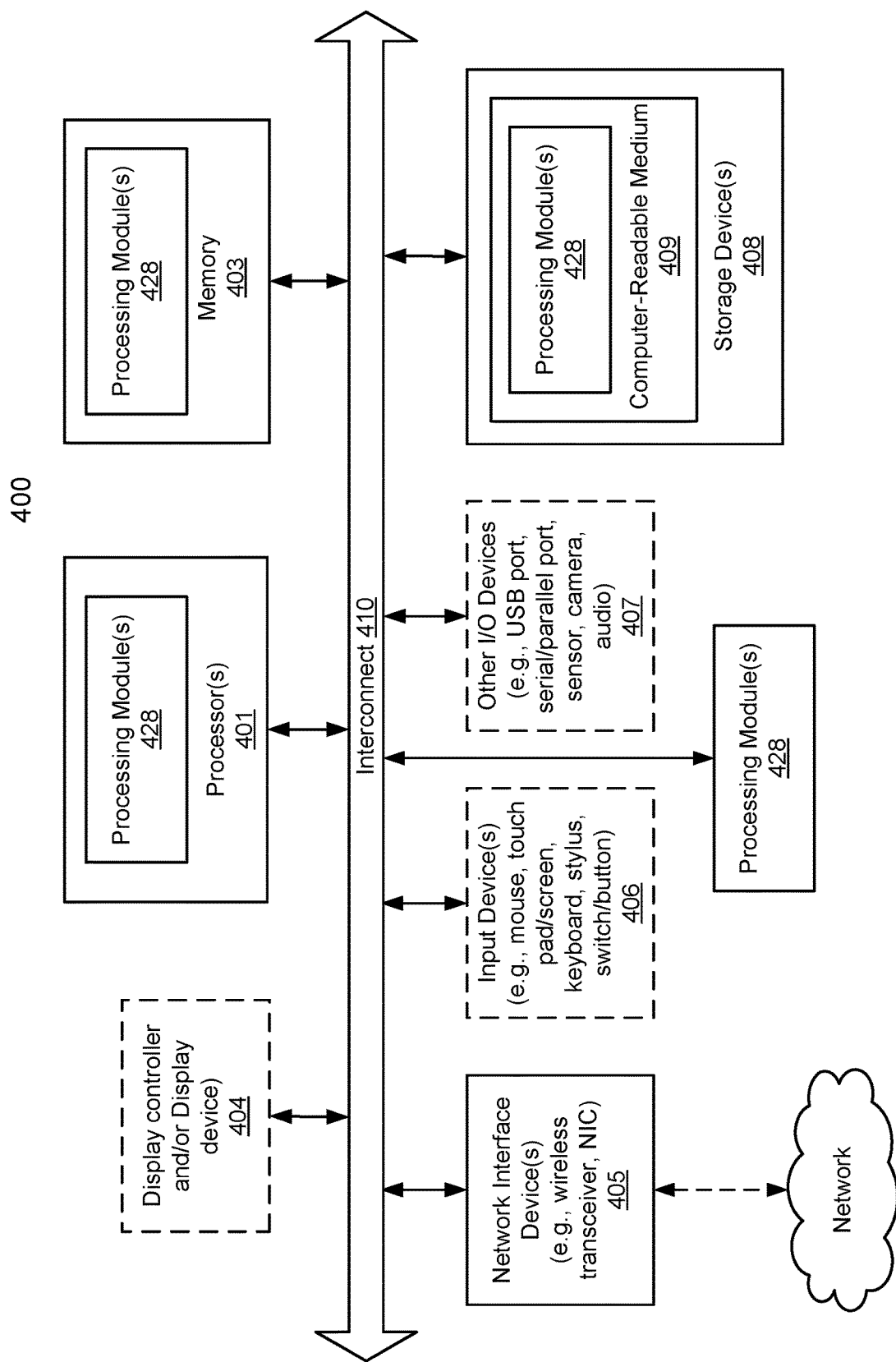
FIG. 4 shows a block diagram illustrating a data processing system in accordance with an embodiment.

Any of the components illustrated in FIGS. 1-2F may be implemented with one or more computing devices. Turning to FIG. 4, a block diagram illustrating an example of a data processing system (e.g., a computing device) in accordance with an embodiment is shown. For example, system 400 may represent any of data processing systems described above performing any of the processes or methods described above. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-408 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 400 may further include IO devices such as devices (e.g., 405, 406, 407, 408) including network interface device(s) 405, optional input device(s) 406, and other optional IO device(s) 407. Network interface device(s) 405 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs or similar devices. In addition, processing module/unit/logic 428 can be implemented as firmware or functional circuitry within hardware devices. Further, processing module/unit/logic 428 can be implemented in any combination hardware devices and software components.

Note that while system 400 is illustrated with various components of a data processing system, it is not intended to represent any particular architecture or manner of interconnecting the components; as such details are not germane to embodiments of the present invention. It will also be appreciated that network computers, handheld computers, mobile phones, servers, and/or other data processing systems which have fewer components or perhaps more components may also be used with embodiments of the invention.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments of the invention as described herein.

In the foregoing specification, embodiments have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data processing system to provide computer implemented services, the data processing system comprising:
   hardware resources used to provide the computer implemented services;
   a fan adapted to generate a gas flow proximate to the hardware resources for thermal management;
   a thermal manager adapted to:
      generate a first voltage signal indicating a rate of operation for the fan to implement, and
      output the first voltage signal;
   an interconnect positioned to operably connect the thermal manager and the fan, the interconnect also operably connecting the thermal manager and the fan to the hardware resources and a power supply of the data processing system, and the interconnect comprising both power and data buses;
   a first voltage signal to current signal converter positioned between the thermal manager and the interconnect, and adapted to convert the first voltage signal to a first current signal on the interconnect; and
   a first current signal to voltage signal converter positioned between the fan and the interconnect, and adapted to:
      convert the first current signal to a second voltage signal, and
      present the second voltage signal to the fan.

2. The data processing system of claim 1, wherein the first current signal being independent of a load presented to an interconnect side of the first voltage signal to current signal converter and the fan comprises a connector to the interconnect that presents a variable resistance depending on operation of the fan, the variable resistance causing the load presented to the interconnect side of the first voltage signal to current signal converter to vary depending on the operation of the fan.

3. The data processing system of claim 1, wherein the first voltage signal to current signal converter comprises a first current mirror adapted to receive a first current generated with the first voltage signal and output the first current signal to the interconnect.

4. The data processing system of claim 3, wherein the first current signal to voltage signal converter comprises a voltage divider driven by a direct current voltage source and the first current signal, wherein driving the voltage divider with the first current signal modulates an output voltage of the voltage divider as the second voltage signal.

5. The data processing system of claim 1, further comprising:
   a second voltage signal to current signal converter positioned between the fan and the interconnect, and adapted to convert a third voltage signal to a second current signal on the interconnect.

6. The data processing system of claim 5, wherein the second voltage signal to current signal converter comprises a second current mirror adapted to receive a third current generated with the third voltage signal and output the second current signal to the interconnect.

7. The data processing system of claim 5, wherein the second current signal to voltage signal converter comprises a voltage divider driven by a direct current voltage source and the second current signal, wherein driving the voltage divider with the second current signal modulates an output voltage of the voltage divider as the fourth voltage signal.

8. The data processing system of claim 5, further comprising:
   a printed circuit board comprising the interconnect,
   wherein the fan and at least one of the first current signal to voltage signal converter and second voltage signal to current signal converter is packaged as a fan module operably connected to the interconnect a set of contacts of the fan module, the set of contacts manifesting a variable resistance between the fan module and the interconnect.

9. The data processing system of claim 1, wherein the thermal manager comprises a microcontroller adapted to:
   manage an operating point of the fan using a pulse width modulation signal encoded on the first voltage signal; and
   monitor the fan for impairment.

10. The data processing system of claim 9, wherein monitoring the fan for impairment comprises:
    converting the fourth voltage signal to the measured rotation rate of the fan;
    making a comparison between the measured rotation rate of the fan and an expected rate of rotation of the fan; and
    determining whether the fan is impaired based on the comparison.

11. The data processing system of claim 1, wherein the interconnect comprises a first trace over which the first current signal is transmitted and a second trace over which the second current signal is transmitted.

12. The data processing system of claim 5, wherein the second current signal being independent of a second load presented to an interconnect side of the third voltage signal to current signal converter.

13. The data processing system of claim 12, further comprising:
    a second current signal to voltage signal converter positioned between the interconnect and the thermal manager, and adapted to:
       convert the second current signal to a fourth voltage signal, and
       present the fourth voltage signal to the thermal manager to indicate a measured rotation rate of the fan.

14. The data processing system of claim 13, further comprising:
    a tachometer that measures the measured rotation rate of the fan and generates the third voltage signal based on the measured rotation rate of the fan, wherein the first voltage signal being generated by the thermal manager based on the measured rotation rate of the fan.

15. A method of thermally managing a data processing system providing computer implemented services, the method comprising:
    generating, by a thermal manager of the data processing system, a first voltage signal carrying fan rate information in a magnitude of the first voltage signal, the fan rate information indicating a rotation rate for a fan of the data processing system should rotate;

converting, by a voltage signal to current signal converter of the data processing system, the first voltage signal to a first current signal;

applying, by the voltage signal to current signal converter, the first current signal to a first side of an interconnect that connects the thermal manager to the fan, the interconnect also connecting the thermal manager and the fan to the hardware resources and a power supply of the data processing system, and the interconnect comprising both power and data buses;

generating, by a current signal to voltage signal converter, a second voltage using the first current signal, the second voltage signal carrying the fan rate information in a magnitude of the second voltage signal; and operating the fan at the rotation rate based on the second voltage signal.

16. The method of claim 15, wherein the first current signal having a magnitude that is independent of a load presented to an interconnect side of the voltage signal to current signal converter.

17. The method of claim 16, wherein the fan comprises:
a motor and a plurality of blades, the motor being adapted to rotate at different speeds to modify a rate of gas flow based on the second voltage signal, the gas flow being proximate to hardware resources of the data processing system that provide the computer implemented services; and contacts that operably connect to the interconnect and introduce a variable resistance in a path of the first current signal, the variable resistance varying depending on the rotation speed of the fan.

18. A non-transitory computer readable medium storing instructions that, when executed by a processor, cause a method for thermally managing a data processing system providing computer implemented services, the method comprising:

generating, by a thermal manager of the data processing system, a first voltage signal carrying fan rate information in a magnitude of the first voltage signal, the fan rate information indicating a rotation rate for a fan of the data processing system should rotate;

converting, by a voltage signal to current signal converter of the data processing system, the first voltage signal to a first current signal;

applying, by the voltage signal to current signal converter, the first current signal to a first side of an interconnect that connects the thermal manager to the fan, the interconnect also connecting the thermal manager and the fan to the hardware resources and a power supply of the data processing system, and the interconnect comprising both power and data buses;

generating, by a current signal to voltage signal converter, a second voltage using the first current signal, the second voltage signal carrying the fan rate information in a magnitude of the second voltage signal; and operating the fan at the rotation rate based on the second voltage signal.

19. The non-transitory computer readable medium of claim 18, wherein the first current signal having a magnitude that is independent of a load presented to an interconnect side of the voltage signal to current signal converter.

20. The non-transitory computer readable medium of claim 19, wherein the fan comprises:
a motor and a plurality of blades, the motor being adapted to rotate at different speeds to modify a rate of gas flow based on the second voltage signal, the gas flow being proximate to hardware resources of the data processing system that provide the computer implemented services; and contacts that operably connect to the interconnect and introduce a variable resistance in a path of the first current signal, the variable resistance varying depending on the rotation speed of the fan.

* * * * *